(12) United States Patent
Berger

(10) Patent No.: US 7,015,497 B1
(45) Date of Patent: Mar. 21, 2006

(54) SELF-ALIGNED AND SELF-LIMITED QUANTUM DOT NANOSWITCHES AND METHODS FOR MAKING SAME

(75) Inventor: Paul R. Berger, Columbus, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 10/649,046

(22) Filed: Aug. 27, 2003

Related U.S. Application Data

(60) Provisional application No. 60/406,241, filed on Aug. 27, 2002.

(51) Int. Cl.
*H01L 29/06* (2006.01)

(52) U.S. Cl. .............................. 257/14; 257/15; 257/17; 257/30

(58) Field of Classification Search .................. 257/14, 257/30, 15, 17; 438/962
See application file for complete search history.

(56) References Cited

OTHER PUBLICATIONS

Amlani, I. et al., Digital Logic Gate Using Quantum-Dot Cellular Automata, *Science*, 284, pp. 289-291 (Apr. 9, 1999).
Fay, P. et al., Integration of InAs/AlSb/GaSb Resonant Interband Tunneling Diodes with Heterostructure Field-Effect Transistors for Ultra-High-Speed Digital Circuit Applications, *IEEE*, pp. 162-165 (1999).
Fay, P. et al., A New Integrated Laboratory Course for Microwave Circuit Design and Measurements, *International Conference on Engineering and Computer Education*, Rio de Janeiro, 4 pages (Aug., 1999).
Klimeck, G. et al., Development of a Nanoelectronic 3-D (NEMO 3-D) Simulator for Multimillion Atom Simulations and Its Application to Alloyed Quantum Dots, 35 pages (Jan. 7, 2002).
Nayak, D. et al., Rapid Thermal Oxidation of GeSi Strained Layers, *Appl. Phys. Lett.*, 56, pp. 66-68 (Jan. 1, 1990).
Ahn, S.J. et al., Asynchronous analogue-to-digital converter for single-electron circuits, *Electronics Letters*, 34, pp. 172-173 (1998).
Amlani, I. et al., Demonstration of a six-dot quantum cellular automata system, *Applied Physics Letterws*, 72 pp. 2179-2181 (1998).
Arai, K. et al., Static Frequency Divider Featuring Reduced Circuit Complexity by Utilizing Resonant Tunneling Diodes in Combination with HEMT's, *IEEE Electron Device Letters*, 18, pp. 544-546 (1997).
Avrutin, V.S. et al., Silicon molecular beam epitaxial growth on ultra-small mesa structures, *Journal of Crystal Growth*, 157, pp. 276-279 (1995).
Ben-Jacob, E. et al., DNA transistor and quantum bit element: Realization of nano-biomolecular logical devices, *Physics Letters A*, 263, pp. 199-202 (1999).

(Continued)

*Primary Examiner*—Sara Crane
(74) *Attorney, Agent, or Firm*—Standley Law Group LLP

(57) ABSTRACT

The present invention provides a method for forming quantum tunneling devices comprising the steps of: (1) providing a quantum well, the quantum well comprising a composite material, the composite material comprising at least a first and a second material; and (2) processing the quantum well so as to form at least one segregated quantum tunneling structure encased within a shell comprised of a material arising from processing the composite material, wherein each segregated quantum structure is substantially comprised of the first material. The present invention also comprises additional methods of formation, quantum tunneling devices, said electronic devices.

26 Claims, 3 Drawing Sheets

OTHER PUBLICATIONS

Bennett, C.H. et al., Mixed-state entanglement and quantum error corrections, *Physical Review A*, 54, pp. 3824-3851 (1996).

Berger, P.A. et al., Role of strain and growth conditions on the growth front profile of $In_xGa_{1-x}As$ on GaAs during the pseudomorphic growth regime, *Appl. Phys. Letter*, 53, pp. 684-686 (1988).

Broekaert, T.P.E. et al., A Monolithic 4-Bit 2-Gsps Resonant Tunneling Analog-to-Digital Converter, *IEEE Journal of Solid-State Circuits*, 33, pp. 1342-1349 (1998).

Chan, H.L. et al., Compact multiple-Valued Multiplexers Using Negative Differential Resistance Devices, *IEEE Journal of Sold-State Circuits*, 31, pp. 1151-1156 (1996).

Fay, P. et al., Fabrication of Monolithically-Integrated InAlAs/InGaAs/InP HEMTs and InAs/AlSb/GaSb Resonant Interband Tunneling Diodes, *IEEE Transaction on Electron Devices*, 48, pp. 1282-1284 (2001).

Feldheim, D.L. et al., Self-assembley of single electron transistors and related devicces, *Chemical Society Reviews*, 27, pp. 1-12 (1998).

Fujisawa, T. et al., Resonant tunneling properties of single electron transistors with a novel double-gate geometry, *Appl. Phys. Lett.*, 68, pp. 526-528 (1996).

Fujiwara, A. et al., Double-Island Single-Electron Devices-A Useful Unit Device for Single-Electron Logic LSI's, *IEEE Transactions on Electron Devices*, 46, pp. 954-959 (1999).

Fulton, T.A. et al., Observation of Single-Electron Charging Effects in Small Tunnel Junctions, *Physical Review Letters*, 59, pp. 109-112 (1987).

Fulton, T.A. et al., Determination of Coulomb-Blockade Resistances and Observation of the Tunneling of Single Electrons in Small-Tunnel-Junction Circuits, *Physical Review Letters*, 67, pp. 3148-3151 (1991).

Hobart, K.D. et al., Growth of low-dimensional structures on nonplanar patterned substrates, *Journal of Crystal Growth*, 157, pp. 338-343 (1995).

Fukuda, H. et al., Fabrication of silicon nanopillars containing polycrystalline silicon/insulator multilayer structures, *Appl. phys. Lett.*, 70, pp. 333-335 (1997).

Jancu, J.M. et al., Empirical *spds\** tight-binding calculation for cubic semiconductors: General method and material parameters, *Physical Review B*, 57, pp. 6493-6507 (1998).

Jin, G. et al., Control of the arrangement of self-organized Ge dots on patterned Si(001) substrates, *Thin Solid Films*, 369, pp. 49-54 (2000).

Kamins, T.I. et al., Lithographic positioning of self-assembled Ge islands on Si(001), *Appl. Phys. Lett.*, 71, pp. 1201-1203 (1997).

LeGoues, F.K. et al. Kinetics and mechanism of oxidation of SiGe: dry versus wet oxidation, *Appl. Phys. lett.*, 54, pp. 644-646 (1989).3.

LeGoues, F.K. et al., Oxidation studies of SiGe, *J. Appl. Phys.*, 65, pp. 1724-1728, (1989).

Lent, C.S. et al., Lines of interacting quantum-dot cells: A binary wire, *J. Appl. Phys.*, 74, pp. 6227-6233, (1993).

Likharev, K.K., Single-Electron Devices and Their Applications, *Proceedings of the IEEE*, 87, pp. 606-632 (1999).

Liou, H.K., et al. Effects of Ge concentration on SiGe oxidation behavior, *Appl. Phys. Lett.*, 59, pp. 1200-1202 (1991).

Liu, H.I. et al., Self-limiting oxidation of Si nanowires, *J. Vac. Sci. Technol. B.*, 11(6), pp. 2532-2537 (1993).

Liu, H.I. et al., Self-limiting oxidation for fabricating sub-5 nm silicon nanowires, *Appl. Phys. Lett.*, 64, pp. 1383-1385 (1994).

Mo, Y.W. et al., Mimetic Pathway in Stranski-Krastanov Growth of Ge on Si(001), *Physical Review Letters*, 65, pp. 1020-1023 (1990).

Nakazato, K. et al., Single-Electron Memory, *Electronics Letters*, 29, pp. 384-385 (1993).

Nayak, D.K. et al., Wet oxidation of GeSi strained layers by rapid thermal processing, *Appl. Phys. Lett.*, 57, pp. 369-371 (1990).

Orlov, A.O. et al., Realization of a Functional Cell for Quantum-Dot Cellular Automata, *Science*, 277, pp. 928-930 (1997).

Orlov, A.O. et al., Experimental demostration of a binary wire for quantum-dot cellular automata, *Applied Physics Letters*, 74, pp. 2875-2877 (1999).

Pamulapati, J. et al., Realization of In-Situ Sub Two-Dimensional Quantum Structures by Strained Layer Growth Phenomena in the $In_xGa_{1-x}As/GaAs$ System, *Journal of Electronic Materials*, 25, pp. 479-483 (1996).

Pashkin, Y.A. et al., Room-temperature Al single-electron transistor made by electron-beam lithography, *Applied Physics Letters*, 76, pp. 2256-2258 (2000).

Pooley, D.M. et al., Coulomb blockade in silicon nanopillars, *Applied Physics Letters*, 74, pp. 2191-2193 (1999).

Pooley, D.M. et al., Fabrication and electron transport in multilayer silicon-insulator-silicon nanopillars, *J. Vac. Sci. Technol. B.*, 17(6), pp. 3235-3238 (1999).

Prabhakaran, K. et al., In situ oxidation of a thin layer of Ge on Si(001): Observation of Ge to $SiO_2$ transition, *Appl. Phys. Lett.*, 62, pp. 864-866 (1993).

Prabhakaran, K. et al., Oxidation of Ultrathin SiGe Layer on Si(001): Evidence for Inward Movement of Ge, *Jpn. J. Appl. phys.*, 33, pp. 1837-1838 (1994).

Prabhakaran, K. et al., Fabrication of multiperiod $Si/SiO_2/$Ge layered structure through chemical bond manipulation, *Applied Physics Letters*, 72, pp. 3169-3171 (1998).

Schittenhelm. P. et al., Photluminescence study of the crossover from two-dimensional to three-dimensional growth for Ge on Si(100), *Appl. Phys. Lett.*, 67, pp. 1292-1294 (1995).

Schmidt, O.G. et al., Formation of carbon-induced germanium dots, *Appl. Phys. Lett.*, 71 pp. 2340-2342 (1997).

Schoelkopf, R.J., The Radio-Frequency Single-Electron Transistor (RF-SET): A Fast and Ultrasensitive Electrometer, *Science*, 280, pp. 1238-1242 (1998).

Seabaugh. A. et al., Resonant Tunneling Circuit Technology: Has it Arrived?, *IEEE*, pp. 119-122 (1997).

Seabaugh, A. et al., Transistors and Tunnel Diodes For Analog/Mixed-Signal Circuits and Embedded Memory, *IEEE*, pp. 429-432 (1998).

Shao, X. et al., Strain modification in thin $Si_{1-x-y}Ge_xC_y$ alloys on (100) Si for formation of high density and uniformity sized quantum dots, *Journal of Applied Physics*, 85, pp. 578-582 (1999).

Shen, J. et al., Static Random Access Memories Based on Resonant Interband Tunneling Diodes in the InAs/GaSb/AlSb Material System, *IEEE Electron Device Letters*, 16, pp. 178-180 (1995).

Shimizu, N. et al., $In_{0.53}Ga_{0.47}As/AlAs$ resonant tunnelling diodes with switching time of 1.5ps, *Electronics Letters*, 31, pp. 1695-1697 (1995).

Stein, H.J. et al., Hydrogen-accelerated thermal donor formation in Czochralski silicon, *Appl. Phys. Lett.*, 56, pp. 63-65 (1990).

Sunamura, H. et al., Island formation during growth of Ge on Si(100): A study using photoluminescence spectroscopy, *Appl. Phys. Lett.*, 66, pp. 3024-3026 (1995).

Takahashi, Y. et al., Size Dependence of the Characteristics of Si Single-Electron Transistors on SIMOX Substrates, *IEEE Transactions on Electron Devices*, 43, pp. 1213-1217 (1996).

Teichert, C. et al., Self-Organization in Growth of Quantum Dot Superlattices, *Physical Review Letters*, 76, pp. 1675-1678 (1996).

Tougaw, P.D. et al., Bistable saturation in coupled quantum-dot cells, *J. Appl. Phys.*, 74, pp. 3558-3566 (1993).

Tsukagoshi, K., Operation of logic function in a Coulomb blockade device, *Applied Physics Letters*, 73, pp. 2515-2517 (1998).

Tucker, J.R., Complementary digital logic based on the "Coulomb blockade", *J. Appl. Phys.*, 72, pp. 4399-4413 (1992).

Usami, N. et al., Realization of crescent-shaped SiGe quantum wire structures on a V-groove patterned Si substrate by gas-source Si molecular beam epitaxy, *Appl. Phys. Lett.*, 63, pp. 2789-2791 (1991).

Van der Wagt, J.P.A. et al., RTD/HFET Low Standby Power SRAM Gain Cell, *IEEE Electron Device Letters*, 19, pp. 7-9 (1998).

Van der Wagt, J.P.A., Tunneling-Based SRAM, *Proceedings of the IEEE*, 87, pp. 571-595 (1999).

Waho, T. et al., Resonant-Tunneling Diode and HEMT Logic Circuits with Multiple Thresholds and Multilevel Output, *IEEE Journal of Solid-State Circuits*, 33, pp. 268-274 (1998).

Wang, X. et al., Germanium dots with highly uniform size distribution grown on Si(100) substrate bymolecular beam epitaxy, *Appl. Phys. Lett.*, 71, pp. 3543-3545 (1997).

Wei, Y. et al., Controlled growth of $SiO_2$ tunnel barrier and crystalline Si quantum wells for Si resonant tunneling diodes, *J. Appl. Phys.*, 81, pp. 6415-6424 (1997).

Wilk, G.D. et al., Electrical Characteristics of High-Quality Sub-25-Å Oxides Grown by ultraviolet Ozone Exposure at Low Temperature, *IEEE Electron Device Letters*, 20, pp. 132-134 (1999).

Xie, Y.H. et al., Relaxed template for fabricating regularly distributed quantum dot arrays, *Appl. Phys. Lett.*, 71, pp. 3567-3568 (1997).

Yano, K. et al., Room-Temperature Single-Electron Memory, *IEEE Transactions on Electron Devices*, 41, pp. 1628-1638 (1994).

Yoshikawa, N. et al., Complementary Digital Logic using Resistively Coupled Single-Electron Transistor, *jJpn. J. Appl. Phys.*, 35, pp. 1140-1145 (1996).

Yoshikawa, N. et al., Single Electron Transfer Logic Gate Family, *Jpn. J. Appl. Phys.*, 38, pp. 433-438 (1999).

Zhu, J.H. et al., Two-dimensional ordering of self-assembled Ge islands on vicinal Si(001) surfaces with regular ripples, *Applied Physics Letters*, 73, pp. 620-622 (1998).

SET or RTD nanoswitches:
Lateral Transport
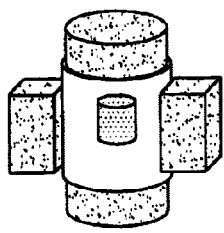 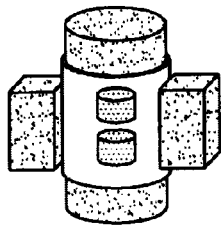 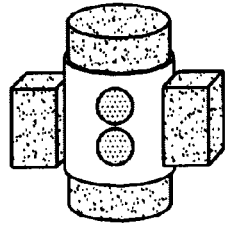
FIG-1a  FIG-1b  FIG-1c
Vertical Transport
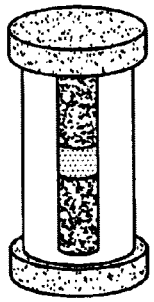 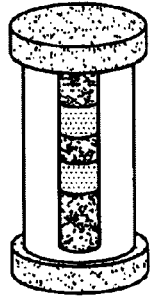
FIG-1d  FIG-1e
QCA node switches:
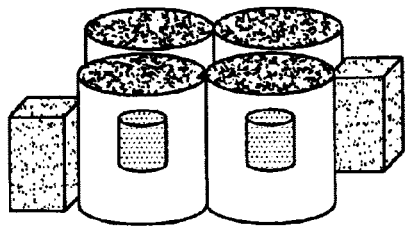 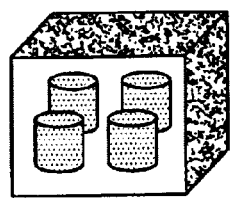 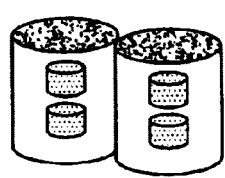
FIG-1f  FIG-1g  FIG-1h

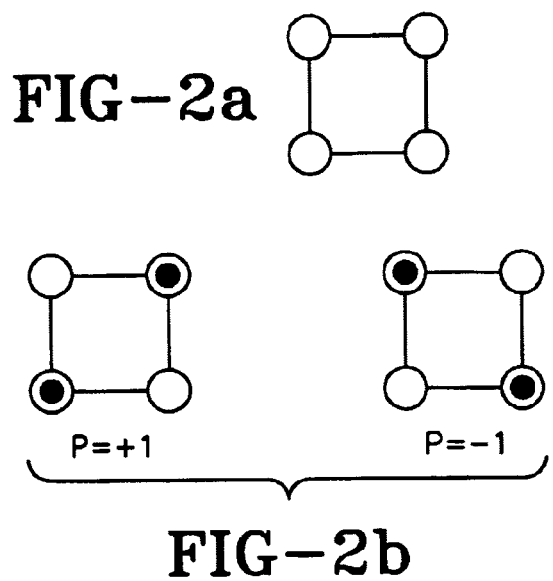
FIG-2a
FIG-2b
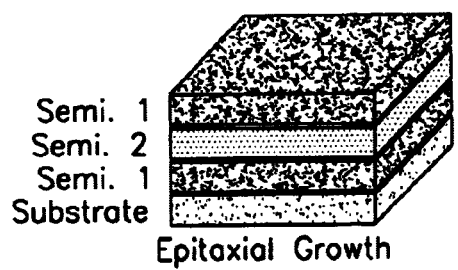
FIG-3a
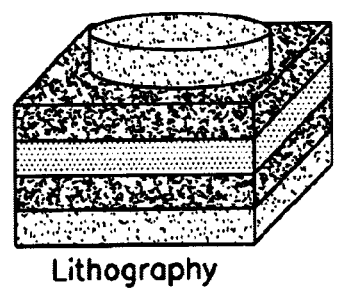
FIG-3b
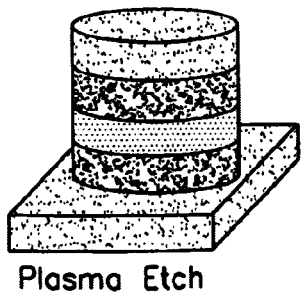
FIG-3c
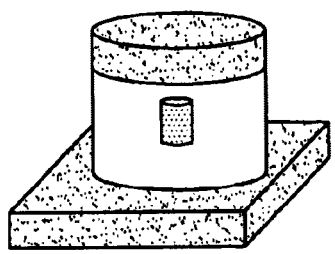
FIG-3d
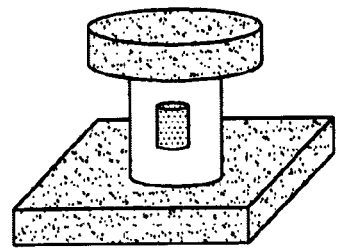
FIG-3e

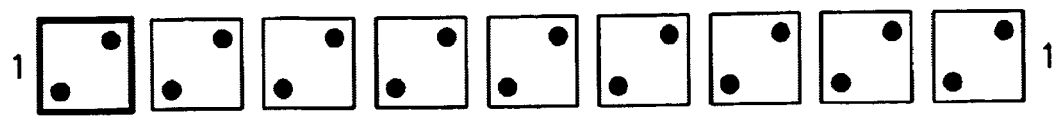
FIG-4a
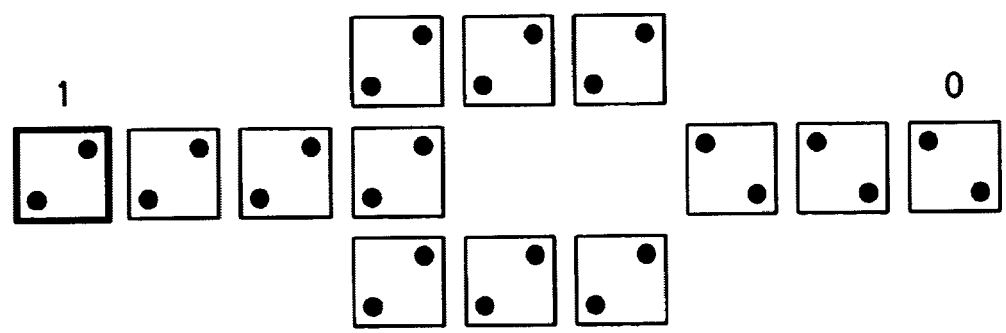
FIG-4b
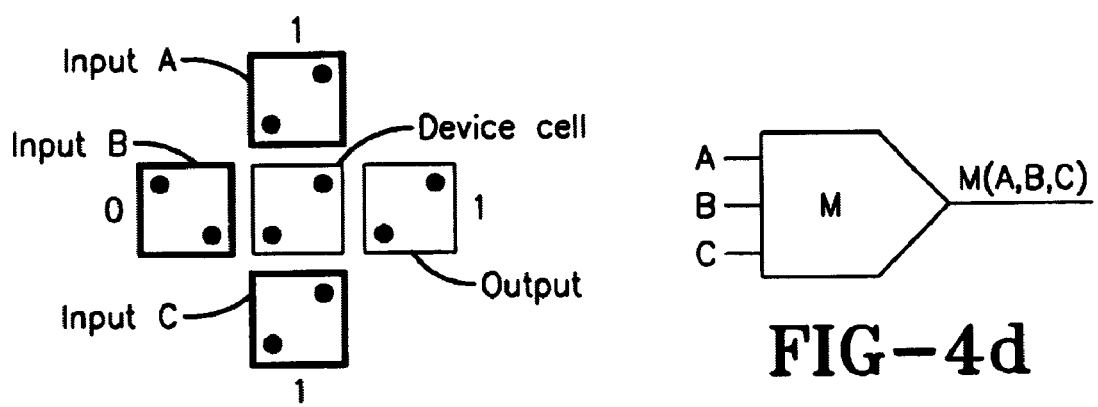
FIG-4c
FIG-4d
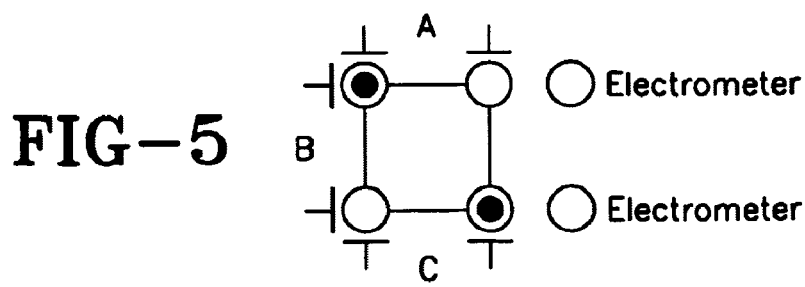
FIG-5

SELF-ALIGNED AND SELF-LIMITED QUANTUM DOT NANOSWITCHES AND METHODS FOR MAKING SAME

This application claims the benefit of U.S. Provisional Application Ser. No. 60/406,241, filed Aug. 27, 2002, which is incorporated herein in its entirety by reference.

The present invention was made with Government support under Grant No. ECS-0196054 awarded by the National Science Foundation. The United States Government may have certain rights to this invention under 35 U.S.C. §200 et seq.

TECHNICAL FIELD OF THE INVENTION

The present invention is in the field of nanoscale electronics. Specifically, the present invention is in the field of methods for forming segregated quantum structures for use in nanoscale electronics.

BACKGROUND AND SUMMARY OF THE INVENTION

As used herein, the term "segregated quantum structure" shall be understood to mean an isolated mass of material capable of holding an extra carrier. Typically, a segregated quantum structure of the present invention will be encased in a shell of processed semiconductor material in all three dimensions.

Further, the term "quantum dot" as used herein is synonymous with the term "segregated quantum structure" as used herein.

As used herein, the term "quantum well" shall be understood to mean a precursor configuration of unprocessed materials, which when processed will give rise to the formation of segregated quantum structures. Typically, a quantum well of the present invention will provide carrier confinement in only one dimension when processed. The term "thinned quantum well" shall be understood to mean the precursor configuration of processed materials prior to re-processing.

The present invention includes: methods for forming quantum tunneling devices, various quantum tunneling devices and various electronic devices.

A preferred method of the present invention for forming quantum tunneling devices comprises the steps of: (1) providing a quantum well, the quantum well comprises a composite material, the composite material comprises at least a first and a second material; and (2) processing the quantum well so as to form at least one segregated quantum tunneling structure encased within a shell comprised of a material arising from processing the composite material, wherein each segregated quantum structure is substantially comprised of the first material.

While the composite material may comprise any suitable mixture, doped mixture, or blend of at least tow materials, it is generally preferred that the composite material comprise a material selected from the group consisting of: composites comprising silicon, composites comprising germanium, composite comprising carbon, a silicon-germanium composite, a silicon-carbon composite, a germanium-carbon composite, a silicon-tin composite, a silicon-germanium-carbon composite, a silicon-germanium-carbon-tin composite, a gallium-arsenic composite, an indium-arsenic composite, an aluminum-arsenic composite, an aluminum-gallium-arsenic composite, an indium-gallium-arsenic composite, an indium-phosphorus composite, an indium-antimony composite, a gallium-antimony composite, an aluminum-antimony composite, an indium-gallium-antimony composite, a gallium-aluminum-antimony composite, an indium-gallium-aluminum-antimony composite, a gallium-aluminum-antimony composite, an indium-aluminum-antimony composite, an indium-gallium-aluminum-antimony composite, an indium-nitrogen composite, a gallium-nitrogen composite, an aluminum-nitrogen composite, an indium-gallium-nitrogen composite, a gallium-aluminum-nitrogen composite, an indium-gallium-aluminum-nitrogen composite, an indium-gallium-arsenic-nitrogen composite, a zinc-sulfur composite, a zinc-selenium composite, a zinc-tellurium composite, a cadmium-sulfur composite, a cadmium-tellurium composite, a mercury-sulfur composite, a mercury-selenium composite, a mercury-tellurium composite, a mercury-cadmium-tellurium composite, and mixtures thereof.

It is further preferred that at least a portion of the shell is sufficiently thin enough to permit quantum tunneling of electrons from a first segregated quantum structure to a second structure selected from the group consisting of segregated quantum structures and electrodes. In order to ensure that the shell is sufficiently thin enough to permit quantum tunneling, it is preferred that the shell is reduced in thickness after processing.

While any appropriate processing method may be used to create the segregated quantum structure, the preferred methods include oxidation, reduction, and nitridation. An appropriate processing method is a processing method in which one of the materials undergoes a preferential reaction wherein that material has a faster reaction rate than the other materials. It is preferred that an appropriate processing method be self-limiting. It is further preferred that an appropriate processing method cause the migration of at least one of the materials into segregated quantum structures while transforming at least some of the remaining materials into a shell of a material arising from the process.

It is preferred that the segregated quantum structure has no dimension greater than about 500 nanometers.

In order to control uniformity in quantum tunneling devices of the present invention, it is preferred to apply a mask to the quantum well. Further, it is additionally preferred to remove at least a portion of the material arising from processing the composite material from the shell thereby thinning the shell and forming a thinned quantum well. It is even more preferred to re-process the thinned quantum well. It is preferred that the re-processing is accomplished by a process selected from the group consisting of: oxidation, reduction, and nitridation.

It is preferred that each segregated quantum structure is separated from each other segregated quantum structure by material arising from the processing of the composite material.

A preferred quantum tunneling device of the present invention is formed in accordance with the method described above.

A second method of the present invention for forming quantum tunneling devices comprises: (1) providing a quantum well comprising at least three layers, each of the at least three layers comprising a first material, wherein at least one of the at least three layers additionally comprises at least a second material and (2) processing the quantum well so as to form at least one segregated quantum structure comprising at least the second material encased in a material arising from processing the first material.

It is preferred that each layer comprising the second material is disposed between at least two layers not comprising the second material.

It is preferred that the first materials is selected from the group consisting of silicon, germanium, carbon, tin, gallium, arsenic, indium, aluminum, boron, phosphorus, antimony, nitrogen, zinc, sulfur, selenium, tellurium, cadmium, mercury, lead, and mixtures thereof. Additionally, it is preferred that the first material comprises a component selected from the group consisting of elements of group IIA of the periodic table, elements of group IIIA of the periodic table, elements of group IVA of the periodic table, elements of group VA of the periodic table, elements of group VIA of the periodic table, and mixtures thereof.

It is preferred that the second material is selected from the group consisting of silicon, germanium, carbon, tin, gallium, arsenic, aluminum, indium, boron, phosphorus, antimony, nitrogen, zinc, sulfur, selenium, tellurium, cadmium, mercury, lead, and mixtures thereof. Additionally, it is preferred that the second material is selected from the group consisting of elements of group IIA of the periodic table, elements of group IIIA of the periodic table, elements of group IVA of the periodic table, elements of group VA of the periodic table, elements of group VIA of the periodic table, and mixtures thereof.

Although any appropriate processing means may be used to process the quantum well, it is preferred that the processing is accomplished by a process selected from the group consisting of oxidation, reduction, and nitridation.

It is preferred that at least a portion of the first material encasing the at least one segregated quantum structure is sufficiently thin enough to permit quantum tunneling of electrons from a first segregated quantum structure to a second structure selected from the group consisting of segregated quantum structures and electrodes.

A preferred quantum tunneling device of the present invention is formed in accordance with the methods described above.

Yet another method of the present invention for forming quantum tunneling devices, comprises the steps of: (1) growing a quantum well on a substrate, the quantum well comprises at least a first material and a second material; (2) patterning a mask on said quantum well; (3) etching the quantum well so as to form a pillar; and (4) processing the pillar so as to convert the first material thereby forming an altered first material and causing the second material to form at least one segregated quantum structure embedded in the altered first material.

It is preferred that the method additionally comprise the steps of: (1) etching the altered first material so as to form a re-etched pillar; and (2) subjecting the re-etched pillar to a process so as to further alter the re-etched pillar.

It is preferred that the quantum well comprises at least three layers each of which comprises a first material, wherein at least one said layer further comprises a second material.

It is even more preferred that each layer comprising a second material is disposed between at least two layers substantially not comprising the second material.

It is preferred that the substrate comprises a material selected from the group consisting of silicon, germanium, a silicon-carbon mixture, an indium-arsenic mixture, a gallium-arsenic mixture, an aluminum-arsenic mixture, an indium-phosphorus mixture, a gallium-phosphorus mixture, an aluminum-phosphorus mixture, an indium-antimony mixture, an aluminum-antimony mixture, an indium-nitrogen mixture, a gallium-nitrogen mixture, an aluminum-nitrogen mixture, an indium-arsenic mixture, a gallium-antimony mixture, sapphire, alumina, diamond, and mixtures thereof.

It is preferred that the first material is selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof. Alternatively, it is preferred that the first material is selected from the group consisting of elements of group IIA of the periodic table, elements of group IIIA of the periodic table, elements of group IVA of the periodic table, elements of group VA of the periodic table, elements of group VIA of the periodic table, and mixtures thereof.

It is preferred that the second material is selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

It is preferred that the mask is patterned by a process selected from the group consisting of electron-beam lithography, contact lithography, projection lithography, self-assembly through modification by wetting and de-wetting, and nano-imprinting. Further, it is preferred that the mask comprises a material selected from the group consisting of silicon, silicon dioxide, silicon nitride, titanium, gold, platinum, nickel, chromium, aluminum, silver, tantalum, molybdenum and mixtures thereof. It is more preferred that the mask is a photoresist. Although the mask may be of any desired size, it is preferred that the mask has a diameter in the range of about 0.5 nanometers to about 500 nanometers.

It is preferred that the quantum well is etched by a process selected from the group consisting of plasma etching, wet etching with acidic solutions, wet etching with basic solution, anisotropic etching, isotropic etching, barrel etching, reactive ion etching, electron resonance reactive ion etching, and inductively coupled plasma reactive ion etching.

It is preferred that the pillar has a diameter in the range of about 0.5 nanometers to about 500 nanometers.

It is preferred that each of the at least one segregated quantum structures has a diameter of less than about 500 nanometers. It is even more preferred that each of the at least one segregated quantum tunneling structures is substantially crystalline.

It is preferred that the altered first material is etched by a process selected from the group consisting of plasma etching, wet etching with acidic solutions, wet etching with basic solution, anisotropic etching, isotropic etching, barrel etching, reactive ion etching, electron cyclotron resonance reactive ion etching, and inductively coupled plasma reactive ion etching.

It is preferred that the re-etched pillar has a diameter less than the diameter of the pillar.

Preferred quantum tunneling devices of the present invention are formed in accordance with the method described above.

A quantum tunneling device of the present invention comprises: (1) at least one segregated quantum structure; and (2) a casing of a first material encapsulating the at least one segregated quantum structure, wherein the casing is sufficiently thin so as to permit quantum tunneling of electrons from a first segregated quantum structure so a structure selected from the group consisting of segregated quantum structure and electrodes.

It is preferred that the at least one segregated quantum structure has a diameter of less than about 200 nanometers. It is more preferred that the at least one segregated quantum tunneling structure has a diameter of less than about 50 nanometers.

It is preferred that the segregated quantum structure comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

It is preferred that the first material comprises a material selected from the group consisting of silicon, germanium, carbon, tin, gallium, arsenic, indium, aluminum, phosphorus, antimony, nitrogen, zinc, sulfur, selenium, tellurium, cadmium, mercury, and mixtures thereof. Alternatively, it is preferred that the first material comprises a semi-conductive material selected from the group consisting of elements of group IIA of the periodic table, elements of group IIIA of the periodic table, elements of group IVA of the periodic table, elements of group VA of the periodic table, elements of group VIA of the periodic table, and mixtures thereof.

It is preferred that the first material has been altered by a process selected from the group consisting of oxidation, reduction, and nitridation.

It is preferred that the quantum tunneling device has not dimension greater than 500 nanometers.

It is preferred that the casing is substantially non-crystalline. It is further preferred that the at least one segregated quantum structure is substantially crystalline.

It is preferred in quantum tunneling devices having at least two segregated quantum structures, the at least two segregated quantum structures are substantially aligned along an axis so as to form a segregated quantum tunneling wire.

An electronic device of the present invention comprises: (1) a quantum tunneling device, the quantum tunneling device comprises at least one segregated quantum structure and a casing of a first material encapsulating the at least one segregated quantum structure; and (2) at least one electrode, wherein the casing is sufficiently thin so as to permit quantum tunneling of electrons from a segregated quantum structure to the at least one said electrode.

It is preferred that each segregated quantum structure has a diameter less than about 200 nanometers. It is more preferred that each segregated quantum structure has a diameter less than about 100 nanometers. It is most preferred that each segregated quantum structure has a diameter of not exceeding about 25 nanometers.

It is preferred that the segregated quantum structure comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

It is preferred that the first material comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof. Alternatively, it is preferred that the first material comprises a semi-conductive material selected from the group consisting of elements of group IIA of the periodic table, elements of group IIIA of the periodic table, elements of group IVA of the periodic table, elements of the group VA of the periodic table, elements of group VIA of the periodic table, and mixtures thereof.

It is preferred that the first material has been altered by a process selected from the group consisting of oxidation, reduction, and nitridation.

It is preferred that the at least one electrode comprises a material selected from the group consisting of lithium, beryllium, boron, carbon, nitrogen, oxygen, aluminum, silicon, calcium, titanium, vanadium, manganese, iron, cobalt, nickel, copper, zinc, gallium, germanium, arsenic, yttrium, zirconium, niobium, molybdenum, palladium, silver, cadmium, indium, tin, antimony, barium, tantalum, tungsten, iridium, platinum, gold, mercury, thallium, lead, bismuth, and mixtures thereof.

It is preferred that the segregated quantum structure is substantially crystalline. It is further preferred that the casing is substantially non-crystalline.

It is preferred that the electronic device is operational at temperatures in excess of about 1 K. It is more preferred that the electronic device is operational at temperatures in excess of about 200 K.

In electronic devices comprising at least two segregated quantum structures, it is preferred that each segmented quantum structure is encapsulated in a casing of the first material and that each segregated quantum structure is separated from each other segregated quantum structure by a sufficiently thin layer of a first material so as to permit quantum tunneling of electrons from a given segregated quantum structure to at least one other segregated quantum structure.

It is further preferred that the at least two segregated quantum structures are substantially aligned along an axis so as to form a segregated quantum tunneling wire.

A quantum-dot cellular automate node switch of the present invention comprises: (1) at least two quantum tunneling devices, each quantum tunneling device comprising: (a) at least one segregated quantum structure and (b) a casing of a first material encapsulating the at least one segregated quantum structure, wherein each quantum tunneling device is adjacent to at least one other quantum tunneling device such that at least one segregated quantum structure in a first quantum tunneling device is separated by a distance from at least one segregated quantum structure in a second quantum tunneling device, and wherein the distance is sufficiently small so as to permit coulombic interaction between electrons from at least one segregated quantum structure in the first quantum tunneling device and at least one segregated quantum structure in the second quantum tunneling device; and (2) at least two electrodes, each electrode separated from a segregated quantum structure by a distance, wherein the distance is sufficiently small so as to permit coulombic interaction between electrons of the segregated quantum tunneling structure and the electrode.

It is preferred that each segregated quantum structure has a diameter less than about 200 nanometers. It is more preferred that each segregated quantum structure has a diameter less than about 50 nanometers. It is most preferred that each segregated quantum structure has a diameter not exceeding about 10 nanometers.

It is preferred that the segregated quantum structure comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

It is preferred that the first material comprises a material selected from the group consisting of silicon, germanium, carbon, tin, gallium, arsenic, indium, phosphorus, boron, antimony, aluminum, nitrogen, zinc, sulfur, selenium, tellurium, cadmium, mercury, lead, and mixtures thereof. Alternatively, it is preferred that the first material comprises a semi-conductive material selected from the group consisting of elements of group IIA of the periodic table, elements of group IIIA of the periodic table, elements of group IVA of the periodic table, elements of group VA of the periodic table, elements of group VIA of the periodic table, and mixtures thereof.

It is preferred that the first material has been altered by a process selected from the group consisting of oxidation, reduction, and nitridation.

It is preferred that each at least one electrode comprises a material selected from the group consisting of lithium, beryllium, boron, carbon, nitrogen, oxygen, aluminum, silicon, calcium, titanium, vanadium, manganese, iron, cobalt, nickel, copper, zinc, gallium, germanium, arsenic, yttrium, zirconium, niobium, molybdenum, palladium, silver, cadmium, indium, tin, antimony, barium, tantalum, tungsten, iridium, platinum, gold, mercury, thallium, lead, bismuth, and mixtures thereof.

It is preferred that at least one of the at least two segregated quantum structures is substantially crystalline. It is further preferred that the casing is substantially non-crystalline.

It is preferred that the quantum-dot cellular automata node switch of the present invention is operational at temperatures in excess of about 2 K. It is even more preferred that the quantum-dot cellular automata node switch is operational at temperatures in excess of about 200 K.

Another quantum-dot cellular automata node switch of the present invention comprises: (1) a quantum tunneling device, the quantum tunneling device comprises (a) a casing of a first material and (b) at least two segregated quantum structures, wherein each segregated quantum structure is encapsulated in a casing of the first material, and wherein each segregated quantum structure is separated from each other segregated quantum structure by a sufficiently thin layer of the first material so as to permit coulombic interaction between electrons from a first segregated quantum structure to a second segregated quantum structure; and (2) at least two electrodes, each electrode separated from a respective segregated quantum structure by the casing, the casing being sufficiently thin so as to permit coulombic interaction between electrons from the electrode to a respective segregated quantum structure.

It is preferred that each segregated quantum structure has a diameter less than about 200 nanometers. It is more preferred that each segregated quantum structure have a diameter less than about 100 nanometers. It is most preferred that each segregated quantum structure has a diameter less than about 20 nanometers.

It is preferred that the segregated quantum structure comprises a material selected from the group consisting of silicon, germanium, carbon, tin, gallium, arsenic, indium, aluminum, boron, phosphorus, antimony, nitrogen, zinc, sulfur, selenium, tellurium, cadmium, mercury, lead, and mixtures thereof.

It is preferred that the first material comprises a material selected from the group consisting of silicon, germanium, carbon, tin, gallium, arsenic, indium, aluminum, phosphorus, antimony, nitrogen, zinc, sulfur, selenium, tellurium, cadmium, mercury, boron, lead, and mixtures thereof. Alternatively, it is preferred that the first material comprises a semi-conductive material selected from the group consisting of elements of group IIA of the period table, elements of group IIIA of the periodic table, elements of group IVA of the periodic table, elements of group VA of the periodic table, elements of group VIA of the periodic table, and mixtures thereof.

It is preferred that the first material is altered by a process selected from the group consisting of oxidation, reduction, and nitridation.

It is preferred that each electrode comprises a material selected from the group consisting of lithium, beryllium, boron, carbon, nitrogen, oxygen, aluminum, silicon, calcium, titanium, vanadium, manganese, iron, cobalt, nickel, copper, zinc, gallium, germanium, arsenic, yttrium, zirconium, niobium, molybdenum, palladium, silver, cadmium, indium, tin, antimony, barium, tantalum, tungsten, iridium, platinum, gold, mercury, thallium, lead, bismuth, and mixtures thereof.

It is preferred that at least one of the at least two segregated quantum structures is substantially crystalline. It is further preferred that the casing is substantially non-crystalline.

It is preferred that the quantum-dot cellular automata node switch is operational at temperatures in excess of about 2 K. It is more preferred that the quantum-dot cellular automata node switch is operational at temperatures in excess of about 50 K.

BRIEF DESCRIPTION OF THE DRAWINGS

FIG. 1a illustrates a lateral transport SET device of the present invention.

FIG. 1b illustrates a lateral transport RTD device of the present invention.

FIG. 1c illustrates a second lateral transport RTD device of the present invention.

FIG. 1d illustrates a vertical transport SET device of the present invention.

FIG. 1e illustrates a vertical transport RTD device of the present invention.

FIG. 1f illustrates a lateral transport SET-based QCA node switch in accordance with one embodiment of the present invention.

FIG. 1g illustrates a lateral transport RTD-based QCA node switch in accordance with one embodiment of the present invention.

FIG. 1h illustrates a vertical transport RTD-based QCA mode switch in accordance with one embodiment of the present invention.

FIG. 2a is a schematic diagram of a four-segregated quantum structure QCA cell.

FIG. 2b compares the two energetically equivalent arrangements of electrons providing for a cell polarization, P, of +1 and −1.

FIG. 3 is a schematic diagram of the process steps used to form a quantum-tunneling device of the present invention.

FIG. 4a is a schematic of a QCA based quantum wire.

FIG. 4b is a schematic of a QCA inverter.

FIG. 4c is a schematic of a QCA three-input majority gate.

FIG. 4d represents the logic symbol used for the three-input majority gate illustrated in FIG. 4c.

FIG. 5 is a simplified schematic of a three-input majority gate.

DETAILED DESCRIPTION OF THE PREFERRED EMBODIMENT(S)

In accordance with the foregoing summary, the following presents a detailed description of the preferred embodiment(s) of the invention that are currently considered to be the best mode.

The present invention provides a novel process for the formation of segregated quantum structure based switching elements. The present invention can be applied to a variety of circuit architecture including (i) single-electron tunneling (SET) transistors, (ii) represents tunneling diode (RTD)

based circuitry, (iii) quantum-dot cellular automata (QCA), and (iv) quantum computing. Low-power memory can be explored using a SET configuration while logic may be more appropriately explored using a RTD or QCA configuration. The present invention provides an attractive approach to the formation of segregated quantum structures because of its compatibility with existing CMOS technology. Since many RTD-based circuits require driving transistors, this is an important advantage.

A SET can be built using a segregated quantum structure embedded within a casing as the storage node. A metallic etch mask is used as a self-aligned gate electrode. Contacts placed beside the device can be added for lateral transport (see FIGS. 1a–c). Vertical transport (see FIGS. 1d–e) through the device can be accomplished by adding a bottom contact. RTDs are essentially large multi-electron SETs, which allow tunneling into and out of the zero-dimension segregated quantum structure.

The devices can also be assembled into 4-leaf clover clusters, forming QCA nodes (FIG. 1f). For lateral tunneling, the sidewall oxide could be etched away and a self-limiting oxide re-grown (see FIG. 3) using a controlled oxidation process inside a rapid thermal annealing furnace. Metal contacts can then be deposited along these sidewalls using low temperature CVD. Alternative QCA nodes would use multiple segregated quantum structures inside one larger pillar (FIG. 1g). The most unique approach is a vertical QCA node (FIG. 1h) whereby two segregated quantum structures are contained within a single casing. The advantages here are that the electron never needs to tunnel out of the casing and that the vertical stacking permits an even greater packing density. Any background charge can be controlled by external electrodes added adjacent to the devices.

The key for room temperature SET circuits is that the charging energy to add one electron, e, to the channels $E_a = e^2/C$, where C is the capacitance of the island, must exceed the background thermal noise. Generally, this requires that $E_a \geq 10\, k_a T$, but it may need to exceed $100\, k_B T$ for some digital applications. In order to achieve this result, a constraint is held upon the segregated quantum structure's size to achieve desirable C value. Experimentally, an $E_a$ in excess of 100 meV has exhibited noticeable. Coulomb blockade oscillations at room temperature. For a Si/SiO$_2$ segregated quantum structure, a sphere size of approximately 20 nm resulted in a 3–5 aF capacitance for a 150 meV charging energy and room temperature operation. However, the placement of segregated quantum structures in the SET channel and ability to fashion electrical contacts has proved problematic, resulting in lower device yields.

In the present invention, vertical confinement is controlled by the expitaxial growth processes that can achieve sub-monolayer control, and the lateral confinement is dictated by the preferential oxidation of Si versus Ge. Thus, segregated quantum structures with diameters below 20 nm are possible with this process. Further, the segregated quantum structure is centered and embedded in the casings, with precise registration, suitable for fashioning external electrical contacts.

A strong advantage in studying the SETs above is that prior to achieving the dimensional control goals, larger multi-electron SETs can be fashioned into RTDs. Thereby extending the impact of the present invention.

Future generations of ultra-fast digital signal processing systems will require both extremely high device speeds as well as compact circuit topologies in order to implement complex logic functions with low power dissipation. Resonant tunneling diodes (RTDs) are a promising device technology in this regard, as they exhibit extremely high device speeds (switching times as low as 1.5 ps) and the unique current-voltage characteristics of RTDs can be used to greatly reduce the circuit complexity required to realize high-speed logic functions with low power dissipation. There is a significant design history of high-performance logic and mixed-signal circuit design using RTDs, although most of this recent design expertise has been developed for III–V compound semiconductor implementations. We build on this knowledge base, with particular emphasis on implementations suitable for mixed RTD/CMOS FET device technologies.

Circuits that are especially well suited to RTD/FET implementation include comparators, latches, and circuits with controlled hysteresis such as Schmidt triggers. In each of these instances, the performance of the circuit can be increased and the area consumed by the circuit decreased compared to conventional CMOS-only implementations by the inclusion of RTDs in the circuit to provide the bistability and/or latching functions.

The present invention results in a significant improvement in the speed, power, consumption, and integration density of logic circuits. The coupling of the dramatic improvements in functional density (in terms of function/die area) enabled by RTD-based circuits with processing based on conventional CMOS fabrication is one way to enable the continued progression towards tera-scale integration. This will be accomplished in a nearly planar fabrication process that does not require significant retooling of some competitive technologies, e.g., self-assembly. The low power dissipation of RTD-based circuits will permit significantly higher levels of integration than are presently possible for conventional logic circuits.

A schematic diagram of a four-segregated quantum structure QCA cell is shown in FIG. 2a. The cell consists of four-segregated quantum structures positioned at the corners of a square. The cell contains two extra mobile electrons, which are allowed to tunnel between neighboring sites of the cell. Tunneling out of the cell is completely suppressed by the potential barriers between the cells. If the tunnel barriers between dots are sufficiently high, electrons will be well localized on individual segregated quantum structures, and Coulomb repulsion between the electrons will tend to make them occupy antipodal sites in the square as illustrated in FIG. 2b. For an isolated cell, there are two energetically equivalent arrangements of the extra electrons which we denote as a cell polarization P=+1 and P=−1. The term "cell polarization" refers only to this arrangement of charge and does not imply a dipole moment for the cell. The cell polarization is used to encode binary information; P=+1 represents a binary 1 and P=−1 represents a binary 0. As illustrated in FIG. 1, the structure of the fundamental QCA cell is well suited for implementation using a group of four coupled segregated quantum structures fabricated by the methods of the present invention.

The present invention is based upon the exploitation of the different heats of formation of semiconductor oxides in fabricating segregated quantum structures useful for room temperature logic circuits with device-to-device uniformity. For example, SiO$_2$ (−204 kcal/mol) has nearly double the heat of formation of GeO$_2$ (−119 kcal/mol). Therefore, we are able to form germanium (Ge) segregated quantum structures embedded in a SiO$_2$ matrix by lateral nano-oxidation single quantum well composed of a Si/SiGe/Si.

Previous work has demonstrated that oxidation of silicon (Si) quantum wells can create Si quantum wires and segregated quantum structures encased in SiO$_2$, but without the degree of freedom created by SiGe alloys. It has been demonstrated that the Si/SiO$_2$ strain field alone suffices to pinch the oxidation front off and self-limit the oxidative process resulting in Si segregated quantum structures with diameters below 10 nm. It has also been shown that for oxidation of planar SiGe structures, a Ge pile-up occurs in front of the oxidation growth front as the Ge is expelled during the preferential oxidation of Si versus Ge. By careful control of the quantum well's lateral dimensions, these two effects could be used to control this pile-up to create segregated quantum structures embedded, and therefore self-aligned, within the casing produced by the processing. Adjusting the composition and thickness of the quantum well during expitaxial growth (vertical direction) can control the segregated quantum structure's shape and diameter. Thus, this template introduces a self-limiting process for the realization of Ge-rich segregated quantum structures while maintaining segregated quantum structure crystallinity. Vertical tunneling barriers may also be inserted by a variety of techniques.

Alternatively III–V semiconductor material systems also exhibit different heats of formation for oxides of binary semiconductors. Thus, this same approach is harnessed to realize segregated quantum structures formed in and from other material systems.

The following describes a processing technique employed by the present invention in forming segregated quantum structures.

As was pointed out earlier, the preference for Si to oxidize over Ge will be exploited to engineer reliable segregated quantum structures. The first stage in the realization of the segregated quantum structure is the epitaxial growth of quantum wells, as shown in FIG. 3a. The quantum well could, for instance, be comprised of SiGe sandwiched by Si layers. The semiconductor single quantum well could be graded, or a double quantum well employed to create dumbbell shapes or multiple segregated quantum structures, respectively. A smaller concentration of Ge will yield smaller segregated quantum structures.

In FIG. 3b the quantum well undergoes electron-beam lithography to pattern a metal mask of 10–80 nanometers in diameter. After masking, the undesired material is removed by plasma etching as represented by FIG. 3c, thereby forming a pillar. The pillar is then processed, preferably by oxidation, as shown in FIG. 3d. Typically processing of the quantum well will occur at temperatures ranging from 600–1200° C., with a preferred range of from 800–900° C. The quantum well will typically undergo processing from 5 seconds to 2 hours, with a range of 15–30 minutes being more preferable. The environment in which the quantum wells are processed may comprise atmospheric gases, be enriched with oxygen or nitrogen, contain only trace amounts of oxygen or nitrogen, and/or contain inert gases. The concentration of the material which forms the segregated quantum structure, for example germanium, may comprise between 0.1–50% of the quantum well with concentrations from 1–25% being more preferred. During processing, one material is segregated into discrete structures while another material is chemically transformed, preferably into an oxide. Thus, a segregated quantum structure is formed inside a casing of oxidized material. The diameter of the processed pillar can be controlled by a second etch and re-process step, if necessary, as shown in FIG. 3e.

The second etch and re-process step may be necessary for horizontal transport devices because the sidewall may be too think to lateral injection of electrons across it. During re-processing the strain field which pinched off and self-limited the initial processing will be eliminated or reduced, thereby permitting an even smaller segregated quantum structure encased in an even smaller casing. Iterations of etching and processing may be employed to control the ultimate size of the finished product.

While the invention has been described in connection with what is presently considered to be the most practical and preferred embodiments, it is to be understood that the invention is not to be limited to the disclosed embodiment(s), but on the contrary, is intended to cover various modifications and equivalent arrangements included within the spirit and scope of the appended claims, which are incorporated herein by reference.

What is claimed is:

1. A quantum tunneling device formed in accordance with a method comprising the steps of:
   providing a quantum well, said quantum well comprising a composite material, said composite material comprising at least a first and a second material; and
   processing said quantum well so as to form at least one segregated quantum tunneling structure encased within a shell comprised of a material arising from processing said composite material, wherein each said segregated quantum structure is substantially comprised of said first material.

2. A quantum tunneling device formed in accordance with a method comprising the steps of:
   providing a quantum well, said quantum well comprising at least three layers, each of said at least three layers comprising a first material, wherein at least one of said at least three layers additionally comprises at least a second material; and
   processing said quantum well so as to form at least one segregated quantum structure comprising at least said second material encased in a material arising from processing said first material.

3. A quantum tunneling device formed in accordance with a method comprising the steps of:
   growing a quantum well on a substrate, said quantum well comprising at least a first material and a second material;
   patterning a mask on said quantum well;
   etching said quantum well so as to form a pillar; and
   processing said pillar so as to convert said first material thereby forming an altered first material and causing said second material to form at least one segregated quantum structure embedded in said altered first material.

4. A quantum tunneling device comprising:
   at least one segregated quantum structure; and
   a casing of a first material encapsulating said at least one segregated quantum structure, wherein said casing is sufficiently thin so as to permit quantum tunneling of electrons from a first segregated quantum structure to a structure selected form the group consisting of segregated quantum structures and electrodes.

5. The quantum tunneling device according to claim 4 wherein said at least one segregated quantum structure has a diameter of less than about 200 nanometers.

6. The quantum tunneling device according to claim 4 wherein said at least one segregated quantum tunneling structure has a diameter of less than about 50 nanometers.

7. The quantum tunneling device according to claim 4 wherein said segregated quantum structure comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

8. The quantum tunneling device according to claim 4 wherein said first material comprises a material selected from the group consisting of silicon, germanium, carbon, tin, gallium, arsenic, indium, aluminum, phosphorus, antimony, nitrogen, zinc, sulfur, selenium, tellurium, cadmium, mercury, and mixtures thereof.

9. The quantum tunneling device according to claim 4 wherein said first material has been altered by a process selected from the group consisting of oxidation, reduction, and nitridation.

10. The quantum tunneling device according to claim 4 wherein said first material comprises a semi-conductive material selected from the group consisting of elements of group IIA of the peptide table, elements of group IIIA of the periodic table, elements of group IVA of the periodic table, elements of group VA of the periodic table, elements of group VIA of the periodic table, and mixtures thereof.

11. The quantum tunneling device according to claim 4 wherein said quantum tunneling device has no dimension greater than 500 nanometers.

12. The quantum tunneling device according to claim 4 wherein said casing is substantially non-crystalline.

13. The quantum tunneling device according to claim 4 wherein said at least one segregated quantum structure is substantially crystalline.

14. An electronic device comprising:
a quantum tunneling device, said quantum tunneling device comprising at least one segregated quantum structure and a casing of a first material encapsulating said at least one segregated quantum structure; and
at least one electrode, wherein said casing is sufficiently thin so as to permit quantum tunneling of electrons from a segregated quantum structure to said at least one said electrode.

15. The electronic device according to claim 14 wherein each said segregated quantum structure has a diameter less than about 200 nanometers.

16. The electronic device according to claim 14 wherein each said segregated quantum structure has a diameter less than about 100 nanometers.

17. The electronic device according to claim 14 wherein each said segregated quantum structure has a diameter not exceeding about 25 nanometers.

18. The electronic device according to claim 14 wherein said segregated quantum structure comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

19. The electronic device according to claim 14 wherein said first material comprises a material selected from the group consisting of silicon, germanium, carbon, tin, gallium, arsenic, indium, aluminum, phosphorus, boron, antimony, nitrogen, zinc, sulfur, selenium, tellurium, cadmium, mercury, lead, and mixtures thereof.

20. The electronic device according to claim 14 wherein said first material comprises a semi-conductive material selected from the group consisting of elements of group IIA of the periodic table, elements of group IIIA of the periodic table, elements of group IVA of the periodic table, elements of group VA of the periodic table, elements of group VIA of the periodic table, and mixtures thereof.

21. The electronic device according to claim 14 wherein said first material has been altered by a process selected from the group consisting of oxidation, reduction, and nitridation.

22. The electronic device according to claim 14 wherein said at least one electrode comprises a material selected from the group consisting of lithium, beryllium, boron, carbon, nitrogen, oxygen, aluminum, silicon, calcium, titanium, vanadium, manganese, iron, cobalt, nickel, copper, zinc, gallium, germanium, arsenic, yttrium, zirconium, niobium, molybdenum, palladium, silver, cadmium, indium, tin, antimony, barium, tantalum, tungsten, indium, platinum, gold, mercury, thallium, lead, bismuth, and mixtures thereof.

23. The electronic device according to claim 14 wherein said segregated quantum structure is substantially crystalline.

24. The electronic device according to claim 14 wherein said casing is substantially non-crystalline.

25. The electronic device according to claim 14 wherein said electronic device is operational at temperatures in excess of about 1 K.

26. The electronic device according to claim 14, wherein said electronic device is operational at temperatures in excess of about 200 K.

* * * * *

UNITED STATES PATENT AND TRADEMARK OFFICE
CERTIFICATE OF CORRECTION

PATENT NO. : 7,015,497 B1
APPLICATION NO. : 10/649046
DATED : March 21, 2006
INVENTOR(S) : Berger It is certified that error appears in the above-identified patent and that said Letters Patent is hereby corrected as shown below:

Title Page Column 2 Line 11
In section (56), References Cited, OTHER PUBLICATIONS, please delete "Amlani, I. et al., Demonstration of a six-dot quantum cellular automata system, *Applied Physics Letterws*, 72 pp. 2179-2181 (1998)." and insert -- Amlani, I. et al., Demonstration of a six-dot quantum cellular automata system, *Applied Physics Letters*, 72, pp. 2179-2181 (1998). --.

Title Page pg 2 Col. 1 line 20
In section (56), References Cited, OTHER PUBLICATIONS, please delete "Feldheim, D.L. et al., Self-assembley of single electron transistors and related devicces, Chemical Society Reviews, 27, pp. 1-12 (1998)." and insert -- Feldheim, D.L. et al., Self-assembly of single electron transistors and related devices, Chemical Society Reviews, 27, pp. 1-12 (1998). --.

Title Page (col 2) pg 2, line 39
In section (56), References Cited, OTHER PUBLICATIONS, please delete "Schittenhelm. P. et al., Photluminescence study of the crossover from two-dimensional to three-dimensional growth for Ge on Si(100), Appl. Phys. Lett., 67, pp. 1292-1294 (1995)." and insert -- Schittenhelm, P. et al., Photoluminescence study of the crossover from two-dimensional to three-dimensional growth for Ge on Si(100), Appl. Phys. Lett., 67, pp. 1292-1294 (1995).

Title Page Page 3 (col. 2) line 23
In section (56), References Cited, OTHER PUBLICATIONS, please delete "Wang, X. et al., Germanium dots with highly uniform size distribution grown on Si(100) substrate bymolecular beam epitaxy, Appl. Phys. Lett., 71, pp. 3543-3545 (1997)." and insert -- Wang, X. et al., Germanium dots with highly uniform size distribution grown on Si (100) substrate by molecular beam epitaxy, Appl. Phys. Lett., 71, pp. 3543-3545 (1997). --

Title Page (3) Column 2 line 24
In section (56), References Cited, OTHER PUBLICATIONS, please delete "Yoshikawa, N. et al., Complementary Digital Logic using Resistively Coupled Single-Electron Transistor, jJpn. J. Appl. Phys., 35, pp. 1140-1145 (1996)." and insert -- Yoshikawa, N. et al., Complementary Digital Logic Using Resistively Coupled Single-Electron Transistor, Jpn. J. Appl. Phys., 35, pp. 1140-1145 (1996). --

In section (57), last sentence of Abstract, please delete "said" and insert -- and --.

UNITED STATES PATENT AND TRADEMARK OFFICE
CERTIFICATE OF CORRECTION

PATENT NO. : 7,015,497 B1
APPLICATION NO. : 10/649046
DATED : March 21, 2006
INVENTOR(S) : Berger It is certified that error appears in the above-identified patent and that said Letters Patent is hereby corrected as shown below:

In column 1, line 56, please delete "tow" and insert -- two --.

In column 2, line 61, please delete "material and" and insrt -- material; and --.

In column 3, line 1, please delete "materials" and insert -- material --.

In column 4, lines 38-39, please delete "500 nanometers" and insert -- 50 nanometers --.

In column 4, line 60, please delete "so" and insert -- to --.

In column 5, line 21, please delete "not" and insert -- no --.

In column 5, line 27, please delete "structures, the" and insert -- structures, that the --.

In column 5, line 43, please delete "diameter of not" and insert -- diameter not --.

In column 6, line 16, please delete "segmented" and insert -- segregated --.

In column 8, line 39, please delete "mode" and insert -- node --.

In column 8, line 67, please delete "represents" and insert -- resonant --.

In column 9, line 38, please delete "$E_a \geq 10k_a T$" and insert -- $E_a \geq 10k_B T$ --.

In column 9, line 42, please delete "noticeable. Coulomb" and insert -- noticeable Coulomb --.

UNITED STATES PATENT AND TRADEMARK OFFICE
CERTIFICATE OF CORRECTION

PATENT NO. : 7,015,497 B1
APPLICATION NO. : 10/649046
DATED : March 21, 2006
INVENTOR(S) : Berger It is certified that error appears in the above-identified patent and that said Letters Patent is hereby corrected as shown below:

In column 11, line 14, please delete "expitaxial" and insert -- epitaxial --.

In column 11, line 21, please delete "Alternatively" and insert -- Alternative --.

In column 13, line 17, please delete "peptide" and insert -- periodic --.

Signed and Sealed this

Eighth Day of August, 2006

JON W. DUDAS
*Director of the United States Patent and Trademark Office*